United States Patent
Koshimizu et al.

(10) Patent No.: US 6,676,804 B1
(45) Date of Patent: Jan. 13, 2004

(54) METHOD AND APPARATUS FOR PLASMA PROCESSING

(75) Inventors: Chishio Koshimizu, Kitakoma-gun (JP); Hiroyuki Ishihara, Nakakoma-gun (JP); Kimihiro Higuchi, Nakakoma-gun (JP); Koji Maruyama, Nirasaki (JP)

(73) Assignees: Tokyo Electron AT Limited (JP); Japan Science and Technology Corp. (JP)

( * ) Notice: Subject to any disclaimer, the term of this patent is extended or adjusted under 35 U.S.C. 154(b) by 0 days.

(21) Appl. No.: 09/720,910

(22) PCT Filed: Jul. 16, 1999

(86) PCT No.: PCT/JP99/03846

§ 371 (c)(1),
(2), (4) Date: Jan. 2, 2001

(87) PCT Pub. No.: WO00/04576

PCT Pub. Date: Jan. 27, 2000

(30) Foreign Application Priority Data

Jul. 16, 1998 (JP) .......................... 10-219760

(51) Int. Cl.[7] .......................... H05H 1/00; C23C 16/00
(52) U.S. Cl. .......................... 156/345.53; 156/345.51; 156/345.52; 118/724; 118/725; 118/728
(58) Field of Search .......................... 118/724, 725, 118/728, 715; 156/345.51, 345.52, 345.53; 269/390

(56) References Cited

U.S. PATENT DOCUMENTS 5,290,381 A * 3/1994 Nozawa et al. ........ 156/345.27
5,547,539 A * 8/1996 Arasawa et al. ............ 438/715
5,556,500 A * 9/1996 Hasegawa et al. ..... 156/345.27
5,868,848 A * 2/1999 Tsukamoto ............... 11/723 E
6,464,794 B1 * 10/2002 Park et al. .................. 118/728

FOREIGN PATENT DOCUMENTS

| JP | 05217951 | 8/1993 | |
| JP | 7-245292 A | * 9/1995 | ....... H01L/21/3065 |
| JP | 07310187 | 11/1995 | |
| JP | 09129612 | 5/1997 | |
| JP | 10050665 | 2/1998 | |

* cited by examiner

Primary Examiner—Gregory Mills
Assistant Examiner—P. Hassanzadeh
(74) Attorney, Agent, or Firm—Finnegan, Henderson, Farabow, Garrett & Dunner LLP

(57) ABSTRACT

An electrostatic chuck 108 is provided on a lower electrode 106 provided inside a processing chamber 102 of an etching apparatus 100, and a conductive inner ring body 112a and an insulating outer ring body 112b are encompassing the outer edges of a wafer W mounted on the chuck surface. The temperatures of the wafer W and the inner and outer ring bodies 112a and 112b are detected by first~third temperature sensors 142, 144 and 146. A controller 140 controls the pressure levels of He supplied to the space between the center of the wafer W and the electrostatic chuck 108 via first gas outlet ducts 114 and to the space between the outer edges of the wafer W and the electrostatic chuck 108 via second gas outlet ducts 116 and the quantity of heat generated by a heater 148 inside the outer ring body 112b based upon the information on the temperatures thus detected so that the temperatures of the wafer W and the inner ring body 112a are set roughly equal to each other.

10 Claims, 9 Drawing Sheets direction of wafer radius

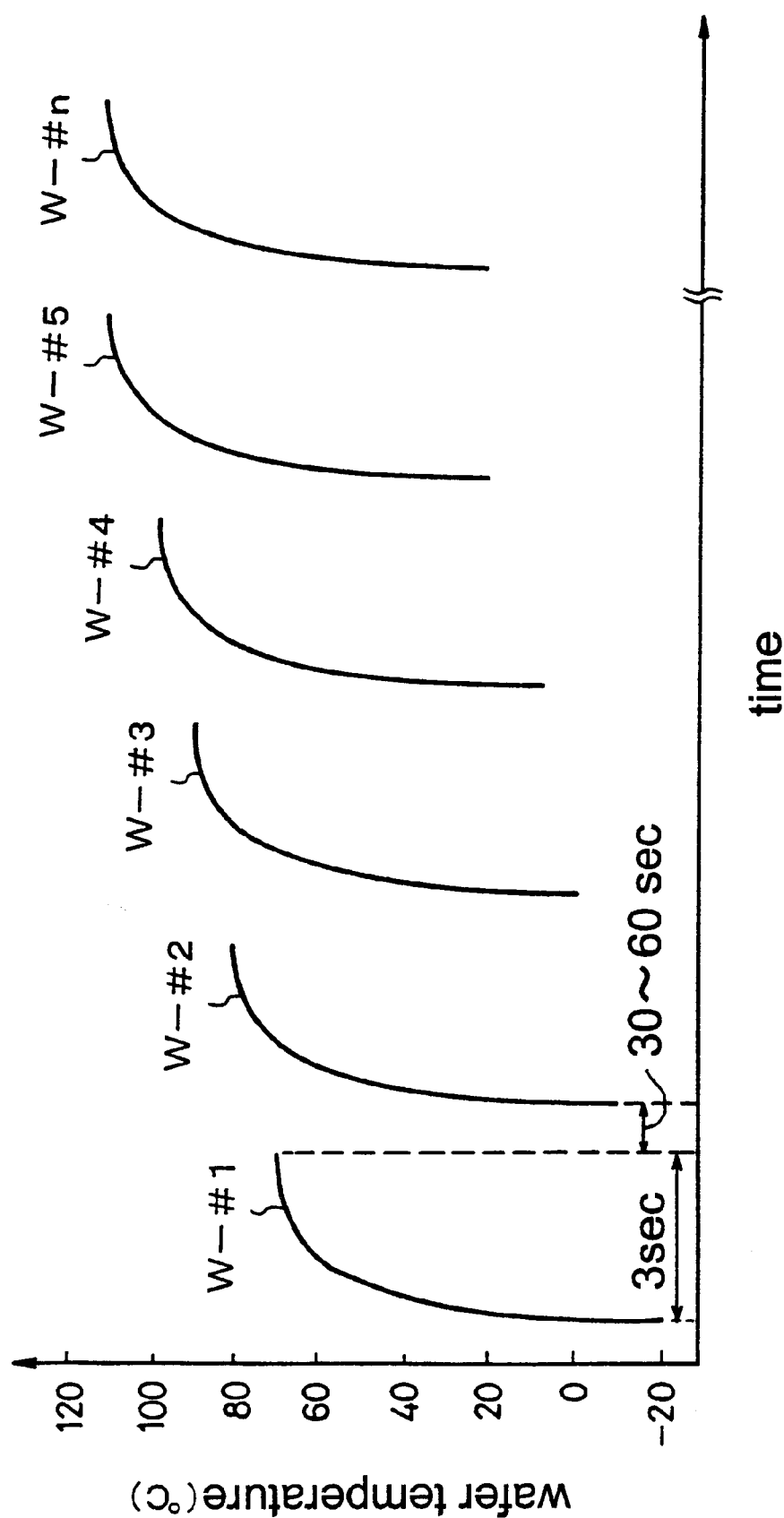

METHOD AND APPARATUS FOR PLASMA PROCESSING

TECHNICAL FIELD

The present invention relates to a plasma processing apparatus and a plasma processing method.

BACKGROUND ART

A plasma etching apparatus is utilized during the process of manufacturing a semiconductor device in the prior art. In the processing chamber of the apparatus, an upper electrode and a lower electrode are set facing opposite each other. In the plasma etching apparatus adopting this structure, the processing gas introduced into the processing chamber is raised to plasma when high-frequency power is applied to the lower electrode and the workpiece placed on the lower electrode, such as a semiconductor wafer (hereafter referred to as a "wafer") becomes etched. In addition, the lower electrode is internally provided with a temperature control mechanism to adjust the wafer temperature. The lower electrode is also provided with a ring body. The ring body is constituted of an inner ring body and an outer ring body. The inner ring body is set so as to encompass the outer edges of the wafer placed on the lower electrode. The outer ring body is set so as to encompass the periphery of the inner ring body.

The inner ring body is constituted of a conductive material. Thus, the external diameter of the wafer can be made to appear electrically large relative to the plasma during the plasma processing. As a result, the plasma is admitted to the entire wafer in an even manner including the outer edges of the wafer as well as the central area. The outer ring body is constituted of an insulating material. Thus, the plasma becomes concentrated on the wafer during the plasma processing so that the plasma can be evenly guided over the entire wafer surface.

However, the conductive inner ring body where intense ion collisions occur, as at the wafer, becomes heated very easily. In addition, the inner ring body is set above the lower electrode unlike the outer ring body which is directly secured to the lower electrode. As a result, since the heat of the inner ring body cannot be fully radiated to the lower electrode in the pressure reduced atmosphere during the processing, the temperature of the inner ring body becomes high. This results in an inconsistent radical concentration in the vicinity of the inner ring body, to reduce the etching rate at the outer edges of the wafer adjacent to the inner ring body. In addition, a discrepancy in the processing is created between the center of the wafer and the outer edges of the wafer and it becomes difficult to achieve uniform processing over the entire wafer surface.

Technologies for processing wafers having a large diameter, e.g., 300 mm, have been proposed in recent years. The processing area at the outer edges of the wafer increases in proportion to the diameter of the wafer. Consequently, the reduction in yield is further exacerbated unless uniform processing is achieved at the outer edges of the wafer, as described above. In addition, in order to improve the productivity of semiconductor element manufacturing, it is necessary to form elements as close to the outer edges of the wafer as possible. However, this technical requirement cannot be satisfied unless uniform processing is achieved at the outer edges of the wafer.

Furthermore, the rate at which ions in the plasma collide with each other at the insulating outer ring body is a lower than the collision rate at the inner ring body. Thus, the temperature of the outer ring body rises more slowly than the temperature at the inner ring body. As a result, when performing continuous processing, the temperature at the outer ring body in particular, is not stable, after the start of processing until a specific number of wafers have been processed. If the temperature at the outer ring body is unstable, the radical concentration at the periphery of the outer ring body, e.g., at the area encompassing the outer edges of the wafer, becomes inconsistent. Consequently, uniform processing is not achieved at the center of the wafer and at the outer edges of the wafer, resulting in difficulty in performing uniform processing over the entire wafer surface. This necessitates processing to be performed on a specific number of dummy wafers until the temperature of the outer ring body becomes stabilized. Thus, the throughput is reduced.

DISCLOSURE OF THE INVENTION

The present invention has been completed by addressing the problems of the prior art discussed above. A first object of the present invention is to provide a new and improved plasma processing apparatus capable of performing uniform processing over the entire surface of a workpiece by generating radicals evenly over the workpiece and the outer edges of the workpiece and a method adopted in this plasma processing apparatus.

A second object of the present invention is to provide a new and improved plasma processing apparatus capable of performing consistent and stable processing on a workpiece immediately after the start of processing and a method adopted in this plasma processing apparatus.

In order to achieve the objects described above, in a first aspect of the present invention, a plasma processing apparatus that performs plasma processing on a workpiece placed on an electrode provided inside a processing chamber comprising a means for temperature control provided at the electrode, a conductive ring body encompassing the periphery of the workpiece placed on the electrode, a first gas supply passage through which a heat transfer gas is supplied to the space between the conductive ring body and the electrode, a means for pressure regulation that regulates the pressure of the heat transfer gas that is supplied so that the temperature of the conductive ring body and the temperature of the workpiece are set roughly equal to each other and a first means for control that controls the means for pressure regulation, is provided.

In this structure, the first means for control adjusts the means for pressure regulation to set the pressure of the heat transfer gas to a specific level. The heat transfer gas, having undergone this adjustment, is then supplied to the space between the conductive ring body and the electrode via the first gas supply passage. The heat transfer gas supplied in this manner increases the thermal conductivity between the conductive ring body and the electrode even in the pressure reduced atmosphere during the processing so that the heat of the conductive ring body can be reliably absorbed by the electrode. Thus, even if the conductive ring body is heated, the temperature of the conductive ring body can be maintained at a specific level. As a result, consistency is achieved in the radical concentration in the vicinity of the outer edges of the workpiece adjacent to the conductive ring body to enable a specific type of processing to be performed at the outer edges of the workpiece. In addition, the pressure of the heat transfer gas can be adjusted as necessary by the means for gas pressure regulation. Consequently, the temperature of the conductive ring body can be set as appropriate for a specific process to be implemented. The means for pressure regulation is controlled so as to roughly equalize the temperature of the conductive ring body with the temperature of the workpiece. This structure achieves consistency in the concentration of radicals distributed around the workpiece and the conductive ring body. As a result, uniform processing is achieved at the center of the workpiece and at the outer edges of the workpiece to realize uniform processing over the entire surface of the workpiece.

Furthermore, it is desirable that the first means for control implement control on the means for pressure regulation based upon temperature information obtained through detection performed by temperature sensors that measure the temperature of the conductive ring body and the temperature of the workpiece. By adopting this structure, the temperature of the conductive ring body can be set at a specific level in conformance to the temperature of the workpiece, which changes continually during the processing.

In addition, one or a plurality of second gas supply passages may be provided at the electrode separately from and independently of the first gas supply passage, through which a heat transfer gas is supplied to the space between the workpiece and the electrode. By adopting this structure, in which the first gas supply passage and the second gas supply passage are formed separately from and independently of each other, the types and supply pressures of the heat transfer gases to be supplied to the space between the workpiece and the electrode and to the space between the conductive ring body and the electrode can be individually selected. The thermal conductivity between the workpiece and the electrode and the thermal conductivity between the conductive ring body and the electrode can be set independently of each other to assure reliable temperature control in the conductive ring body.

The plasma processing apparatus may be further provided with an insulating ring body surrounding the periphery of the conductive ring body, a means for heat application located at the insulating ring body and a second means for control that controls the means for heat application. In this structure, the second means for control implements control on the means for heat application so that the insulating ring body can be heated to a specific temperature in advance before starting the processing. As a result, any changes in the temperature of the insulating ring body that would otherwise occur during the processing are essentially eliminated to allow a specific type of processing to be performed on the workpiece even immediately after the start of processing. Thus, since it is not necessary to stabilize the temperature of the insulating ring body by performing preliminary processing on dummy workpieces, an improvement in throughput is achieved. In addition, since the temperature of the insulating ring body can be controlled as appropriate, the temperature of the insulating ring body can be maintained at a specific level before and after the processing as well as during the processing.

In a second aspect of the present invention, a plasma processing apparatus that performs plasma processing on a workpiece placed on an electrode provided inside a processing chamber, comprising a means for temperature control provided at the electrode, a conductive ring body encompassing the periphery of the workpiece placed on the electrode, a first gas supply passage through which a heat transfer gas is supplied to the space between the conductive ring body and the electrode, a second gas supply passage communicating with the first gas supply passage, through which a heat transfer gas is supplied to the space between the workpiece and the electrode, a means for pressure regulation that regulates the pressure of the heat transfer gas being supplied and a means for control that controls the means for pressure regulation is provided.

By adopting this structure, in which the first gas supply passage and the second gas supply passage are made to communicate with each other, the heat transfer gas can be supplied to the space between the conductive ring body and the electrode without having to connect a gas supply system that is separate and independent of the first gas supply passage. As a result, the structure of the apparatus is simplified. In addition, by adopting the structure described above, which can be achieved without having to greatly modify the apparatus in the prior art described earlier, the present invention can be implemented easily.

In a third aspect of the present invention, a plasma processing apparatus that performs plasma processing on a workpiece placed on an electrode provided inside a processing chamber comprising a means for temperature control provided at the electrode, a conductive ring body encompassing the periphery of the workpiece placed on the electrode, a first gas supply passage through which a heat transfer gas is supplied to the space between the conductive ring body and the electrode, a second gas supply passage through which a heat transfer gas at a first pressure level is supplied to the space between the workpiece and the electrode, a third gas supply passage through which a heat transfer gas at a second pressure level is supplied to the space between the workpiece and the electrode, a first link passage for linking the first gas supply passage and the second gas supply passage that can be opened/closed freely, a second link passage for linking the first gas supply passage and the third gas supply passage that can be opened/closed freely and a means for control that controls the length of time over which the first link passage remains open and the length of time over which the second link passage remains open to set the temperature of the conductive ring body and the temperature of the workpiece roughly equal to each other is provided.

In this structure, the heat transfer gas at the first pressure level is supplied to the first gas supply passage while the first link passage is open. In addition, the heat transfer gas at the second pressure level is supplied to the first gas supply passage while the second link passage is open. The lengths of time over which the first and second link passages remain open are controlled as appropriate by the means for control. As a result, the temperatures of the workpiece and the conductive ring body can be set roughly equal to each other without having to connect a separate and independent gas supply system to the first gas supply passage.

In a fourth aspect of the present invention, a plasma processing apparatus that performs plasma processing on a workpiece placed on an electrostatic chuck formed on a mounting surface of an electrode provided inside a processing chamber comprising a means for temperature control provided at the electrode, a conductive ring body encompassing the periphery of the workpiece placed on the electrostatic chuck and a thermal conductivity adjusting member provided between the electrode and the conductive ring body to set the thermal conductivity between the electrode and the conductive ring body and the thermal conductivity between the electrode and the workpiece roughly equal to each other is provided.

In this structure, the thermal conductivity adjusting member is provided between the conductive ring body and the electrode. Thus, almost uniform thermal conductivity is achieved between the workpiece and the electrode and between the conductive ring body and the electrode. As a result, the temperature of the conductive ring body and the temperature of the workpiece can be essentially matched through a relatively simple structure. In addition, the structure can be easily realized simply by providing the thermal conductivity adjusting member between the conductive ring body and the electrode. Furthermore, the increase in the cost of manufacturing the processing apparatus can be minimized.

In a fifth aspect of the present invention, a plasma processing apparatus that performs plasma processing on a workpiece placed on an electrode provided inside a processing chamber comprising a means for temperature control provided at the electrode, a conductive ring body encompassing the periphery of the workpiece placed on the electrode and a means for pressure application that applies a pressure to the conductive ring body toward the electrode and is capable of adjusting the level of the pressure applied to the conductive ring body, is provided.

By adopting this structure, the conductive ring body can be placed in complete contact with the electrode by the means for pressure application. As a result, the thermal conductivity between the conductive ring body and the electrode is improved so that the heat of the conductive ring body can be absorbed by the electrode. In addition, the means for pressure application is capable of adjusting the level of the pressure applied to the conductive ring body. Thus, the temperature of the conductive ring body can be set at a specific level as appropriate. Furthermore, since the conductive ring body only needs to be pressed against the electrode by the means for pressure application, simplification in the structure of the apparatus is achieved.

In a sixth aspect of the present invention, a plasma processing method for performing plasma processing on a workpiece placed on an electrode provided inside a processing chamber, comprising a step in which a means for temperature control provided at the electrode is adjusted to set the temperature of the electrode to a specific level, a step in which a heat transfer gas is supplied to the space between a conductive ring body encompassing the periphery of the workpiece placed on the electrode and the electrode and a step in which the pressure level of the heat transfer gas being supplied is regulated so as to set the temperature of the workpiece and the temperature of the conductive ring body roughly equal to each other is provided.

In this method, the temperature of the conductive ring body can be controlled by supplying the heat transfer gas at a specific supply pressure to the space between the conductive ring body and the electrode so as to set the temperature of the workpiece and the temperature of the conductive ring body roughly equal to each other. As a result, the thermal conductivity between the conductive ring body and the electrode can be increased. In addition, by regulating the level of the supply pressure of the heat transfer gas, the temperature of the conductive ring body can be adjusted as appropriate. During this process, it is desirable that the supply pressure of the heat transfer gas be controlled based upon temperature information obtained by measuring the temperature of the conductive ring body and the temperature of the workpiece. By adopting such a method, the temperature of the conductive ring body can be matched with the temperature of the workpiece which changes continuously during the processing. Furthermore, a high degree of consistency in the concentration of radicals distributed around the workpiece and the conductive ring body is achieved. Consequently, no discrepancy in the processing occurs between the center of the workpiece and the outer edges of the workpiece, to realize uniform processing over the entire surface of the workpiece.

It is desirable to implement an additional step in which heat is applied to an insulating ring body encompassing the periphery of the conductive ring body to maintain the temperature of the insulating ring body at a constant level during plasma processing performed on the workpiece. This maintains the temperature of the insulating ring body at a specific level before the start of processing. As a result, stable processing can be performed on the workpiece even immediately after the processing starts.

In a seventh aspect of the present invention, a plasma processing method for performing plasma processing on a workpiece placed on an electrode provided inside a processing chamber characterized in that the plasma processing is performed by setting the temperature of the workpiece, which is controlled by a means for temperature control provided at the electrode and the temperature of a conductive ring body encompassing the periphery of the workpiece set on the electrode roughly equal to each other is provided.

In this method, the plasma processing is performed on the workpiece in a state in which the temperature of the workpiece, which is controlled at a specific level, and the temperature of the conductive ring body are practically matched. It is to be noted that the temperature of the workpiece and the temperature of the conductive ring body may be set roughly equal to each other by supplying a heat transfer gas into the space between the conductive ring body and the electrode, by providing a thermal conductivity adjusting member or by pressing the conductive ring body against the electrode as explained earlier in reference to the preceding aspects of the present invention.

In addition, it is desirable to apply heat to an insulating ring body encompassing the periphery of the conductive ring body to maintain it at a constant temperature level. Since this will maintain the temperature of the insulating ring body virtually unchanged, uniform processing is achieved.

BRIEF DESCRIPTION OF THE DRAWINGS

FIG. 4 is a schematic diagram illustrating the temperature changes at individual wafers undergoing continuous etching processing performed by the etching apparatus shown in FIG. 1 on a plurality of wafers;

BEST MODE FOR CARRYING OUT THE INVENTION

The following is an explanation of embodiments of the plasma processing apparatus and the plasma processing method according to the present invention adopted in etching apparatuses and methods employed in the etching apparatuses, given in reference to the attached drawings.

FIRST EMBODIMENT

(1) Overall Structure of the Etching Apparatus

Figure 1:
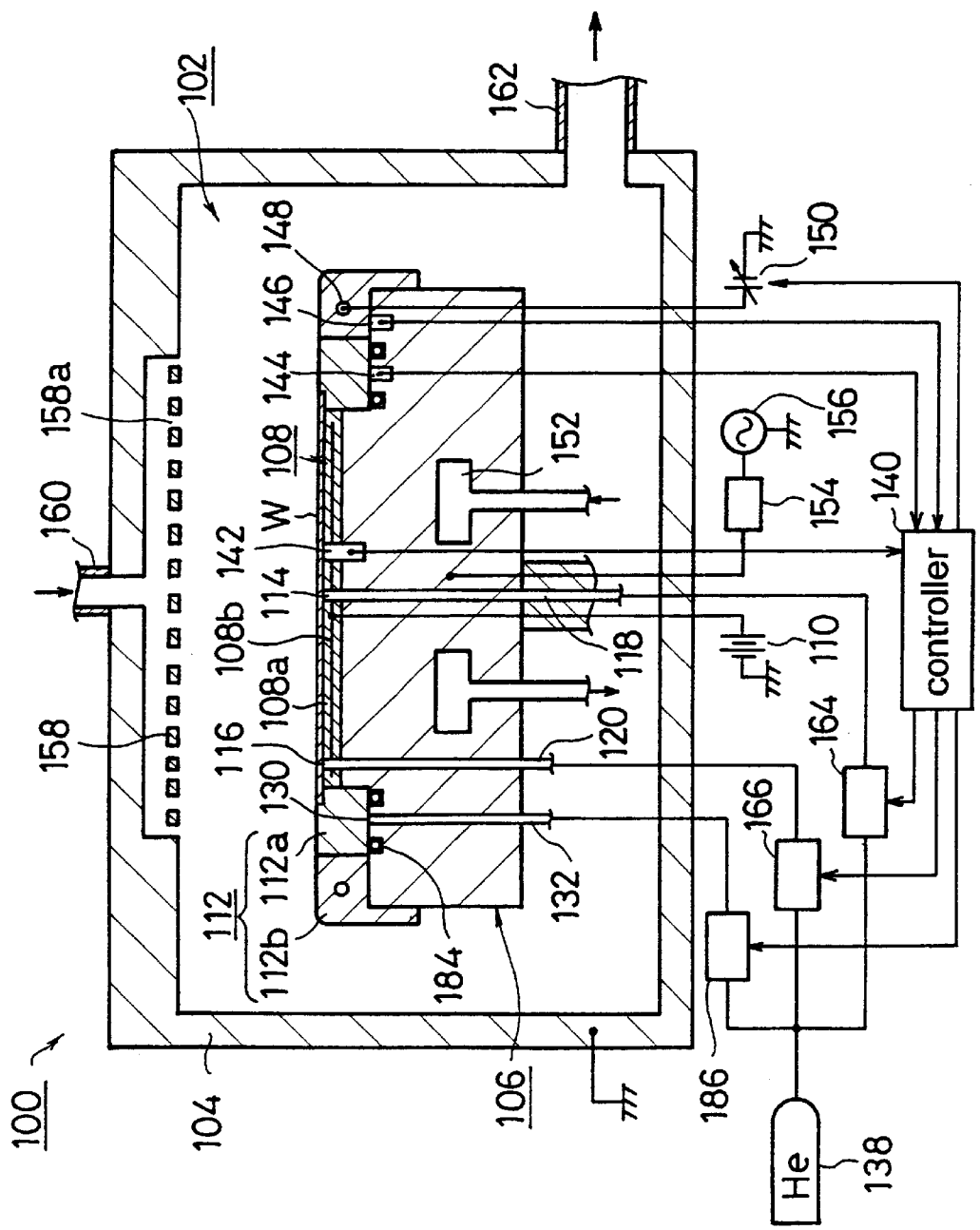
FIG. 1 is a schematic sectional view of an etching apparatus that may adopt the present invention.

First, in reference to FIGS. 1 and 2, the overall structure of an etching apparatus 100 that may adopt the present invention is explained.

A processing chamber 102 of the etching apparatus 100 in FIG. 1 is formed inside a grounded, airtight processing container 104. A lower electrode 106 is provided inside the processing chamber 102. The lower electrode 106 also functions as a mounting stage on which a wafer W is placed. In addition, the lower electrode 106, which is constituted of a conductive metal achieving a high thermal conductivity such as aluminum, is formed in a roughly cylindrical shape. An electrostatic chuck 108 is provided at the mounting surface of the lower electrode 106. The electrostatic chuck 108 is constituted by clamping an electrode 108b with a thin film 108a which may be formed from, for instance, polyimide. The wafer W mounted on the electrostatic chuck 108 structured as described above is held onto the electrostatic chuck 108 when a high-voltage at 1.5 kV output by a high-voltage DC source 110 is applied to the electrode 108b.

In addition, a roughly circular ring body 112 is provided on top of the lower electrode 106. The ring body 112 is constituted of an inner ring body (conductive ring body) 112a and an outer ring body (insulating ring body) 112b. The inner ring body 112a is encompassing the periphery of the electrostatic chuck 108 and the outer edges of the wafer W mounted on the chuck surface of the electrostatic chuck 108. The inner ring body 112a is constituted of a conductive material (including a semiconductor) such as Si, SiC or C (carbon). The outer ring body 112b is encompassing the periphery of the inner ring body 112a and cover the outer edge and a portion of the side of the lower electrode 106. The outer ring body 112b is constituted of an insulating material such as $Al_2O_3$ or $SiO_2$. The inner ring body 112a and the outer ring body 112b are secured to the lower electrode 106 by fastening members (not shown) such as bolts.

At the chuck surface of the electrostatic chuck 108, first and second gas supply ducts 114 and 116 are provided. The first gas supply ducts 114 are formed over specific intervals at positions that allow a heat transfer gas, e.g., He, to be supplied to the center of the wafer W. The second gas supply ducts 116 are provided over specific intervals at positions that allow He to be supplied to the outer edges of the wafer W. The first gas supply ducts 114 and the second gas supply ducts 116 are each connected with a first gas supply pipe 118 and a second gas supply pipe 120 respectively. A first pressure regulating unit 164 and a second pressure regulating unit 166 are provided at the first gas supply pipe 118 and the second gas supply pipe 120 respectively.

Figure 2A:
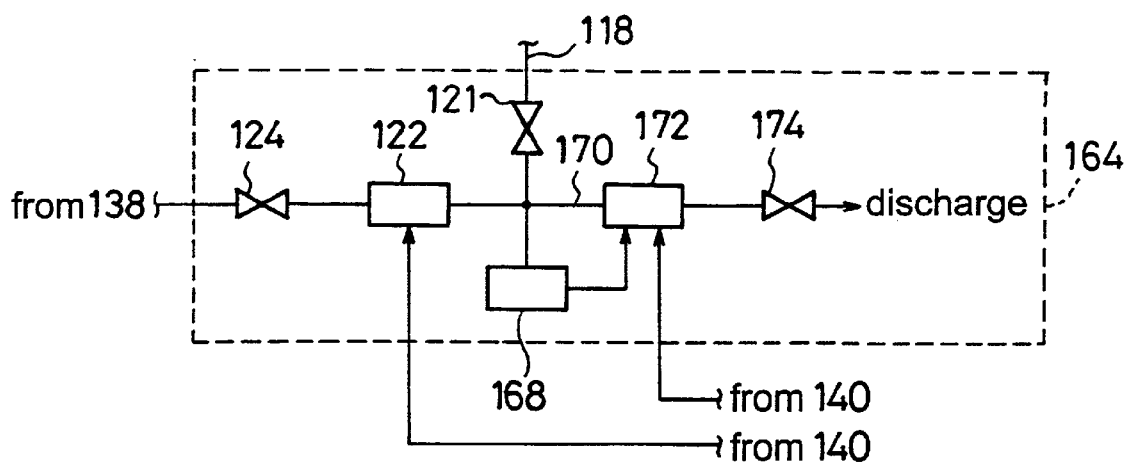
FIGS. 2(a), 2(b), and 2(c) present schematic illustrations of the pressure regulating units in FIG. 1.

As illustrated in FIG. 2(a), a first open/close valve 121, a flow rate control valve (mass flow controller) 122 and a second open/close valve 124 are provided between the first gas supply duct 114 and a gas supply source 138 at the first pressure regulating unit 164. In addition, a manometer (capacitance manometer) 168 and a first discharge pipe 170 are provided between the first open/close valve 121 and the flow rate control valve 122. A pressure regulating valve 172 and a third open/close valve 174 are provided at the first discharge pipe 170. The manometer 168 is connected to the pressure regulating valve 172. A controller 140 is connected to the flow rate control valve 122 and the pressure regulating valve 172.

Figure 2B:
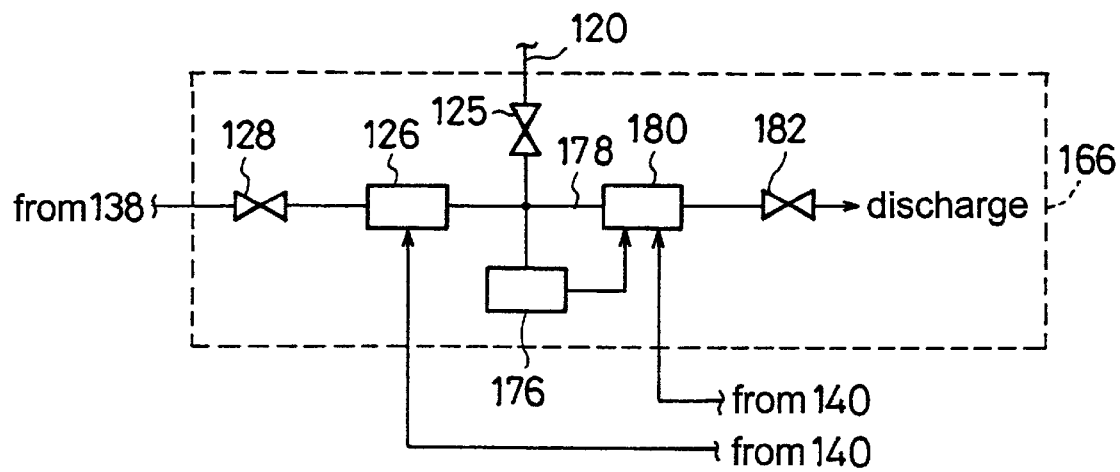

The second pressure regulating unit 166 shown in FIG. 2(b) is structured identically to the first pressure regulating unit 164. In particular, a first open/close valve 125, a flow rate control valve 126 and a second open/close valve 128 are provided between the second gas supply duct 116 and the gas supply source 138. In addition, a manometer 176 and a first discharge pipe 178 are provided between the first open/close valve 125 and the flow rate control valve 126. A pressure regulating valve 180 and a third open/close valve 182 are provided at the first discharge pipe 178. The manometer 176 is connected to the pressure regulating valve 180. The controller 140 is connected to the flow rate control valve 16 and the pressure regulating valve 180, As illustrated in FIG. 1, at the front surface of the lower electrode 106 placed in contact with the inner ring body 112a, third gas supply duct 130 of the embodiment are provided. The third gas supply duct 130 are provided over specific intervals at positions that allow He to be supplied to the bottom surface of the inner ring body 112a. In addition, the space between the inner ring body 112a and the lower electrode 106 to which He is supplied is sealed by an O-ring 184 to achieve airtightness. The third gas supply duct 130 are each connected with a third gas supply pipe 132. A third pressure regulating unit 186 is provided at the third gas supply pipe 132.

Figure 2C:
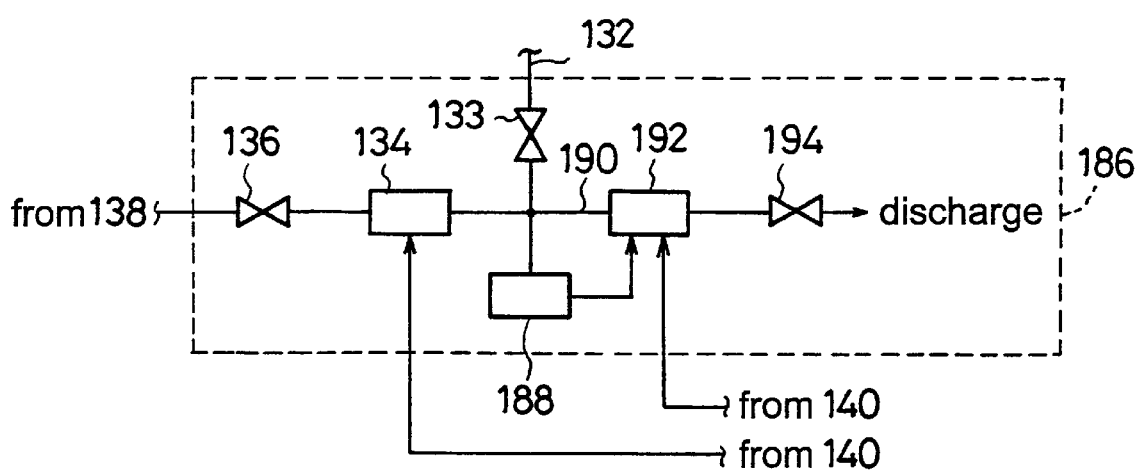

The third pressure regulating unit 186 shown in FIG. 2(c) is structured identically to the first pressure regulating unit 164. Hence, a first open/close valve 133, a flow rate control valve 134 and a second open/close valve 136 are provided between the third gas supply duct 130 and the gas supply source 138. In addition, a manometer 188 and a first discharge pipe 190 are provided between the first open/close valve 133 and the flow rate control valve 134. A pressure regulating valve 192 and a third open/close valve 194 are provided at the first discharge pipe 190. The manometer 188 is connected to the pressure regulating valve 192. The controller 140 is connected to the flow rate control valve 134 and the pressure regulating valve 192.

As illustrated in FIG. 1, first~third temperature sensors 142, 144 and 146 of the embodiment are connected to the controller 140. The first~third temperature sensors 142, 144 and 146 are each constituted of a fiber contact thermometer. The first temperature sensor 142 is exposed at the chuck surface of the electrostatic chuck 108 which is in contact with the wafer W to detect the temperature of the wafer W. The second temperature sensor 144 is exposed at the surface of the lower electrode 106 that comes in contact with the inner ring body 112a to detect the temperature of the inner ring body 112a. The third temperature sensor 146 is exposed at the front surface of the lower electrode 106 that comes in contact with the outer ring body 112b to detect the temperature of the outer ring body 112b.

A heater 148 of the embodiment is provided inside the outer ring body 112b. The heater 148 is connected with a variable source 150. The variable source 150 is connected with the controller 140. Furthermore, the lower electrode 106 is internally provided with a coolant circulating passage constituting a temperature control mechanism. The coolant with its temperature set to, for instance, −20° C., circulates through the coolant circulating passage 152 to control the temperature of the lower electrode 106 as appropriate. In addition, a high-frequency source 156 is connected to the lower electrode 106 via a matching device 154. The high-frequency source 156 outputs high-frequency power for plasma generation at 1700 W with the frequency set to, for instance, 13.56 MHz.

A grounded upper electrode 158 facing opposite the mounting surface of the lower electrode 106 is provided at the ceiling of the processing chamber 102. Numerous gas outlet ports 158a are formed at the upper electrode 158. The gas outlet ports 158a are connected with a processing gas supply source (not shown) via a processing gas supply pipe 160. This structure allows a processing gas, e.g., a mixed gas are constituted of 10 sccm $C_4F_8$, 50 sccm CO, 300 sccm Ar and 5 sccm $O_2$, is supplied into the processing chamber 102 from the processing gas supply source via the gas outlet ports 158a. A vacuum pump (not shown) is connected to the lower portion of the processing container 104 via a second discharge pipe 162. By adopting this structure, the atmosphere inside the processing chamber 102 maintains a reduced pressure level of, for instance, 40 Torr.

Figure 3A:
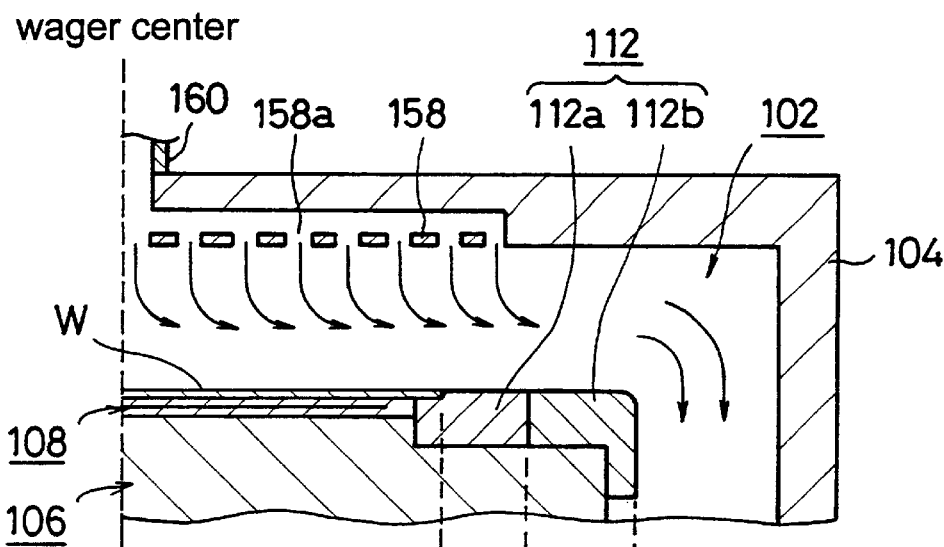
FIG. 3(a) is a schematic sectional view illustrating the inside of the processing chamber in the etching apparatus shown in FIG. 1 along the direction of the radius extending from the center of the wafer.
Figure 3B:
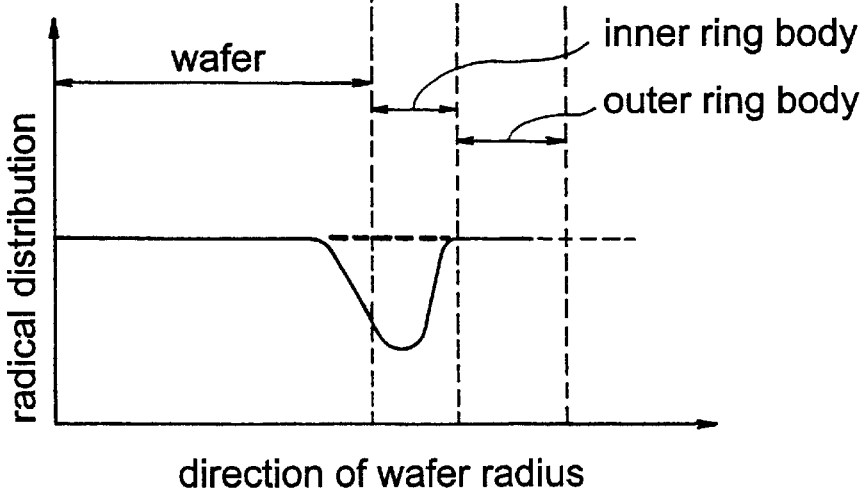
FIG. 3(b) is a schematic diagram illustrating the radial distribution inside the processing chamber in FIG. 3(a)

(2) Relationship between Temperature of Inner Ring Body and Distribution of Radicals in Plasma Next, in reference to FIG. 3, the relationship between the temperature of the inner ring body 112a and the distribution of radicals in the plasma generated inside the processing chamber 102 is explained. It is to be noted that FIG. 3(a) is a schematic sectional view illustrating the inside of the processing chamber 102 along the direction of the radius extending from the center of the wafer W with the arrows in the figure schematically indicating the gas flow inside the processing chamber 102. In addition, FIG. 3(b) illustrates the radical distribution inside the processing chamber 102 in FIG. 3(a).

As shown in FIG. 3(a), gas delivered toward the wafer W through the gas outlet ports 158a first flows along the direction of the radius of the wafer W, then changes its flow near the ring body 112 and is discharged. In addition, if no heat transfer gas is supplied, as in the case of the apparatus in the prior art described earlier, the inner ring body 112a becomes heated to, for instance, approximately 250° C., due to collisions of ions. As a result, as indicated with the solid line in FIG. 3(b), the radical concentration around the inner ring body 112a becomes lowered.

This problem may be overcome by supplying a heat transfer gas to the space between the inner ring body 112a and the lower electrode 106 to increase the thermal conductivity so that the heat generated at the inner ring body 112a is absorbed by the lower electrode 106 in a reliable manner.

(3) Heat Transfer Gas Supply Structure

Next, in reference to FIGS. 1, 2 and 4, the supply structure through which He is supplied to the space between the wafer W and the electrostatic chuck 108 and the space between the inner ring body 112a and the lower electrode 106 is explained.

First, the controller 140 shown in FIG. 1 is notified of the temperature of the wafer W on the electrostatic chuck 108 and the temperature of the inner ring body 112a before the plasma generation. At this point, the temperature of the lower electrode 106 is maintained at, for instance, −20° C. In conformance to the information on the individual temperatures, the controller 140 adjusts the first third pressure regulating units 164, 166 and 186. Thus, the pressure of He supplied to the space between the inner ring body 112a and the lower electrode 106 and the pressure of He supplied to the space between the wafer W and the electrostatic chuck 108 are regulated so as to set the temperature of the entire surface of the wafer W roughly equal to the temperature of the inner ring body 112a. As a result, the temperature of the wafer W and the temperature of the inner ring body 112a are set to roughly equal to each other.

The individual pressure levels of He are maintained at the settings mentioned above at all times by the corresponding first~third pressure regulating units 164, 166 and 186. An explanation is given on the third pressure regulating unit 186 shown in FIG. 2(c), as an example. The He pressure level between the inner ring body 112a and the lower electrode 106 is constantly measured by a manometer 188. The pressure information obtained through the measurement is communicated to a pressure regulating valve 192. The pressure regulating valve 192 adjusts the degree of openness so as to roughly match the actual pressure value thus measured with the pressure value setting set by the controller 140. At this time, if the actual pressure value is larger than of the pressure value setting, the pressure regulating valve 192 is opened to discharge He inside the third gas supply pipe 132 via a first discharge pipe 190. By discharging the He in this manner, the pressure in the space between the inner ring body 112a and the lower electrode 106 is reduced to match the pressure value with the pressure value setting. In addition, the first and second pressure regulating units 164 and 166, too, maintain the pressure value between the wafer W and the electrostatic chuck 108 at the pressure value setting at all times.

Next, as plasma processing starts, the temperature of the wafer W starts to rise and change, as illustrated in FIG. 4, for instance. It is to be noted that FIG. 4 schematically illustrates changes in the temperature occurring at individual wafers W undergoing continuous etching processing performed on a plurality of wafers W. In addition, W-#1~W-#n in FIG. 4 are reference numbers assigned to the individual wafers W.

The changes in the temperature of the wafers W are now explained. The temperature of the wafer W-#1 immediately after the start of continuous processing is maintained at approximately −20° C., which is roughly the same as the temperature of the lower electrode 106, before plasma is generated. The temperature of the wafer W-#1 having undergone the processing will have risen to a level in proportion to the length of the processing time. For instance, immediately after three-minute processing is completed, the temperature of the wafer W-#1 will have risen to approximately 70° C.

There is an interval of approximately 30~60 seconds after the processing of the wafer W-#1 is completed until the processing on the wafer W-#2 starts due to wafer W replacement and the like. However, the polyimide constituting the thin film 108b has a low thermal conductivity. For this reason, the heat at the chuck surface of the electrostatic chuck 108 is not fully absorbed by the lower electrode 106. As a result, the temperature of the wafer W-#2 to undergo the processing next is already approximately −10° C. which is higher than the corresponding temperature of the wafer W-#1 before plasma generation. Furthermore, for the same reason, the temperatures of the wafer W-#2 during the processing and immediately after the processing are higher than the corresponding temperatures of the wafer W-#1. As a result, the temperature of the wafer W-#2 immediately after the processing is completed will have risen to approximately 80° C. Subsequently, the pre-processing through post-processing temperatures of the wafers W up to the wafer W-#5 manifest a relative increase as the processing advances in a similar manner. Moreover, the temperatures of the wafer W-#5~W-#n rise in a roughly identical pattern, as indicated in the profiles in FIG. 4.

Accordingly, He at a specific pressure level is supplied to the space between the inner ring body 112a and the lower electrode 106 so as to essentially match the temperature of the wafer W, which changes as illustrated in FIG. 4, with the temperature of the inner ring body 112a. This achieves consistency in the concentration of radicals above the inner ring body 112a as indicated by the bold dotted line in FIG. 3(b).

In addition, the wafer W is held by the electrostatic chuck 108 as explained earlier. However, the temperature at the outer edges of the wafer W tends to rise higher than the temperature at the center of the wafer W since He supplied to the space between the wafer W and the chuck surface flows toward the outer edges more readily than toward the center. Accordingly, He at different pressure levels is supplied to the center of the wafer W and to the outer edges of the wafer W through the first gas supply ducts 114 and the second gas supply ducts 116 respectively. For instance, and He achieving a pressure level of approximately 7 Torr is supplied to the space between the center of the wafer W and the center of the chuck surface. He achieving a pressure level of approximately 40 Torr is supplied between the outer edges of the wafer W and the outer edges of the chuck surface. Consequently, the temperature at the surface of the wafer W is set equal to or lower than approximately 110° C., which does not allow the photoresist formed at the wafer surface to become damaged.

4. Heater Control Structure

Next, in reference to FIG. 1 again, the structure through which the heater 148 internally provided at the outer ring body 112b is controlled is explained. Since the outer ring body 112b is constituted of an insulating material, as explained earlier, ions in the plasma do not collide with each other readily. For this reason, the temperature of the outer ring body 112b does not become stabilized within the range of approximately 150° C.~200° C. until 5~10 wafers W have been processed after the start of continuous processing.

Accordingly, the outer ring body 112b is preheated to, for instance, approximately 180° C. by the heater 148 prior to the processing start. The heater 148 is controlled by the controller 140 based upon the information on the temperature of the outer ring body 112b detected by the third temperature sensor 146. In this structure, the temperature of the outer ring body 112b is maintained at the specific level after it reaches the specific level. In addition, the heat of the outer ring body 112b is readily radiated to the lower electrode 106. Thus, the temperature of the outer ring body 112b can be maintained at the specific level through the adjustment of the quantity of heat generated by the heater 148. As a result, the concentration of radicals over the wafer W and around the inner ring body 112a can be stabilized.

In the embodiment structured as described above, a higher degree of consistency is achieved in the concentration of radicals over the wafer W and around the ring body 112 even immediately after the start of processing. Consequently, no discrepancy in the etching rate occurs between the center and the outer edges of the wafer W, to enable uniform processing to be performed over the entire surface of the wafer W.

SECOND EMBODIMENT

Figure 5:
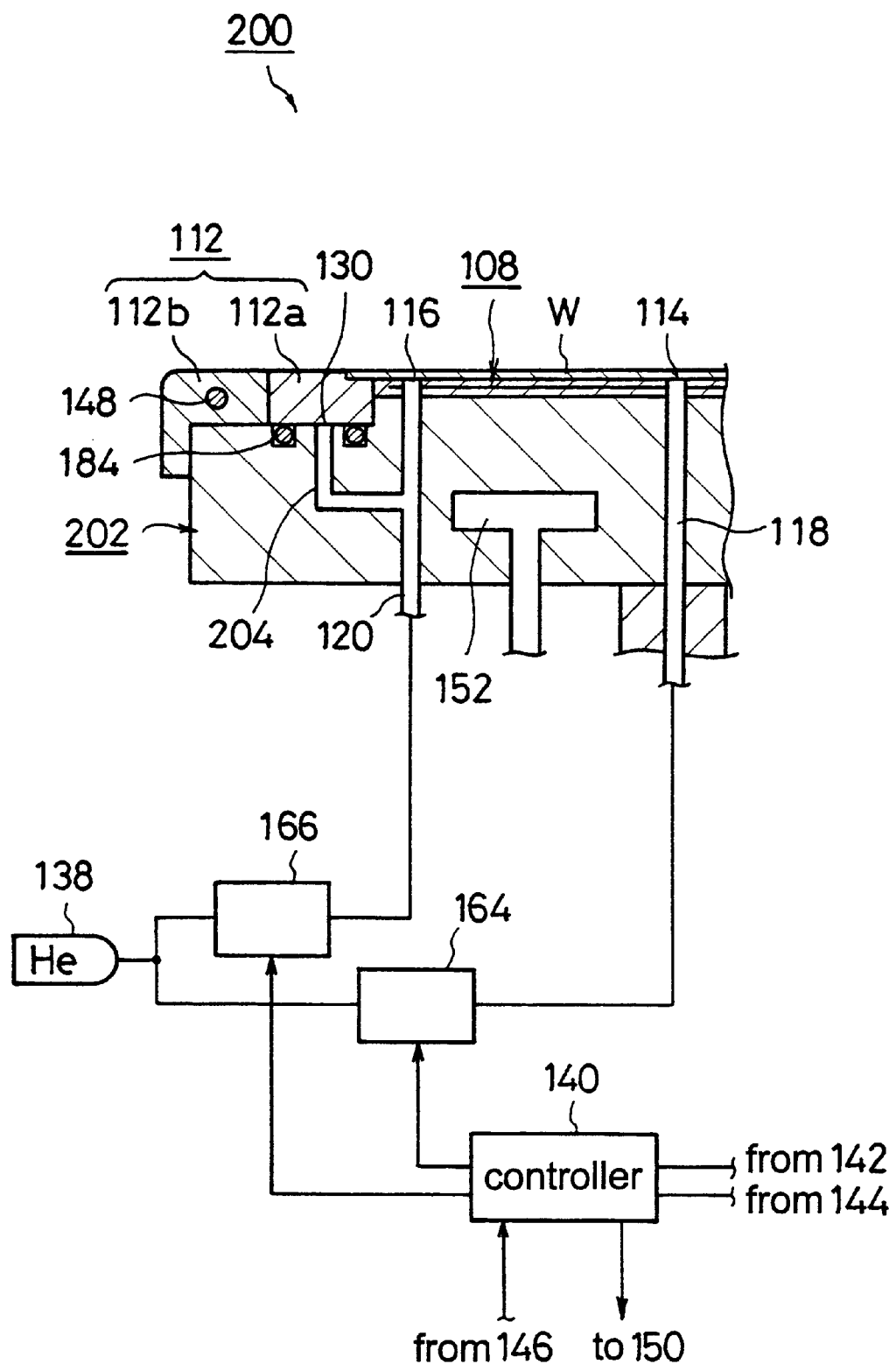
FIG. 5 is a schematic sectional view of another etching apparatus that may adopt the present invention.

Next, in reference to FIG. 5, an etching apparatus 200 in the second embodiment, which may adopt the present invention, is explained.

A lower electrode 202 of the etching apparatus 200 is internally provided with a third gas supply pipe 204. The third gas supply pipe 204 is connected to the third gas supply duct 130 and the second gas supply pipe 120. When this structure is adopted, the pressure of He supplied by the gas supply source 138 is first adjusted by the second pressure regulating unit 166 to a specific level, e.g., approximately 40 Torr. Then, the He is supplied to the space between the outer edges of the wafer W and the electrostatic chuck 108 via the second gas supply pipe 120 and the second gas supply duct 116. The He is also supplied to the space between the inner ring body 112a and the lower electrode 202 via the second gas supply pipe 120, the third gas supply pipe 204 and the third gas supply duct 130. It is to be noted that other structural features of the etching apparatus 200 are roughly identical to those of the etching apparatus 100 explained earlier.

In the embodiment structured as described above, the pressure levels of He supplied through the second and third gas supply ducts 116 and 130 can be individually adjusted by utilizing a single second pressure regulating unit 166. As a result, the structure of the apparatus is simplified to achieve a reduction in the apparatus production cost. In addition, since the second gas supply pipe 120 and the third gas supply pipe 204 are connected inside the lower electrode 202, the embodiment can be realized by making minimal structural modifications on the etching apparatus in the prior art described earlier.

THIRD EMBODIMENT

Figure 6:
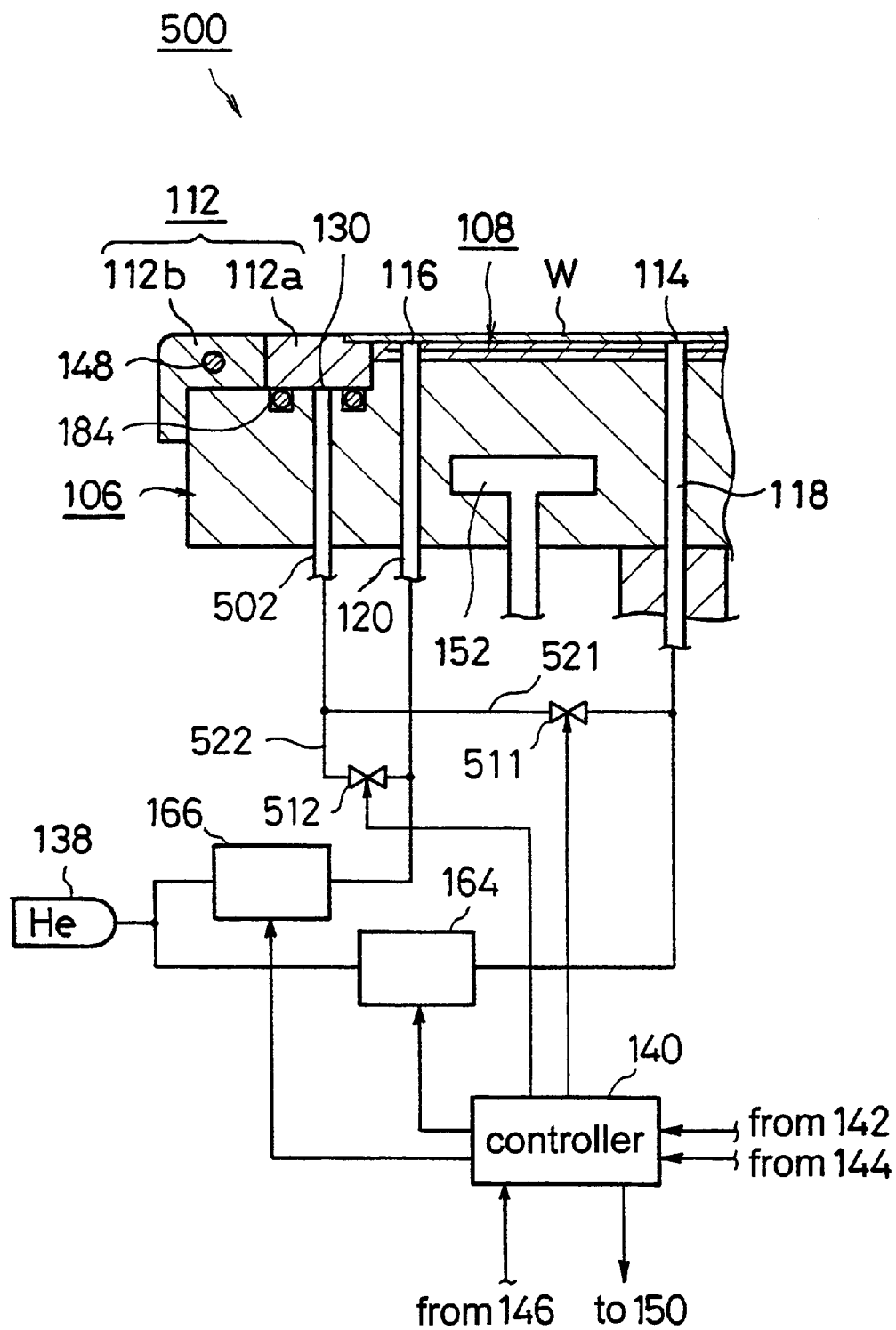
FIG. 6 is a schematic sectional view of yet another etching apparatus that may adopt the present invention.

An etching apparatus 500 in the third embodiment that may adopt the present invention is now explained in reference to FIG. 6.

He achieving a first pressure level, e.g., 7 Torr, is supplied via the first pressure regulating unit 164 to the first gas supply pipe 118 of the etching apparatus 500. He achieving a second pressure level, e.g., 40 Torr, is supplied via the second pressure regulating unit 166 to the second gas supply pipe 120. A third gas supply pipe 502 is connected to a third gas supply duct 130. The third gas supply pipe 502 is connected to the first gas supply pipe 118 and to the second gas supply pipe 120 respectively via a first link pipe 521 and a second link pipe 522. The first link pipe 521 is provided with a first open/close valve 511 and the second link pipe 522 is provided with a second open/close valve 512. The first open/close valve 511 and the second open/close valve 512 are both connected to the controller 140.

By adopting this structure, the first open/close valve 511 and the second open/close valve 512 can be opened/closed as necessary by the controller 140. Thus, when the first open/close valve 511 is open, He at 7 Torr is supplied to the third gas supply pipe 502, whereas when the second open/close valve 512 is open, He at 40 Torr is supplied to the third gas supply pipe 502. By controlling the length of time over which the first open/close valve 511 remains open and the length of time over which the second open/close valve 512 remains open, the temperature of the wafer W and the temperature of the inner ring body 112a can be equalized. It is to be noted that other structural features are roughly identical to those of the etching apparatus 100.

As in the etching apparatus 200, it is not necessary to connect a separate pressure regulating unit to the third gas supply pipe 502 in this embodiment structured as described above, either. As a result, the structure of the apparatus is simplified.

FOURTH EMBODIMENT

Figure 7:
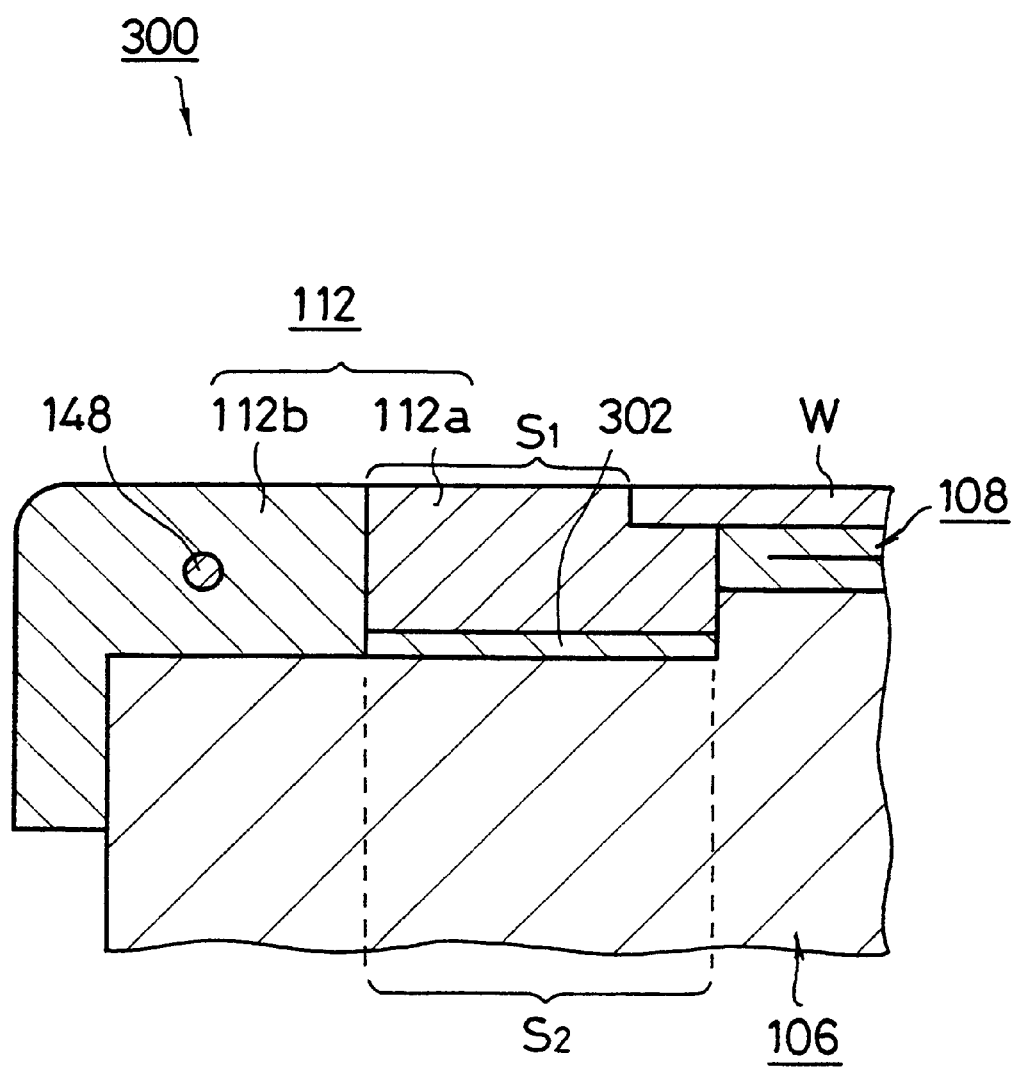
FIG. 7 is a schematic sectional view of yet another etching apparatus that may adopt the present invention.

Next, in reference to FIG. 7, an etching apparatus 300 in the fourth embodiment that may adopt the present invention is explained.

Between the inner ring body 112a and the lower electrode 106 at the etching apparatus 300, a material film 302 to constitute a thermal conductivity adjusting member is provided. This material film 302 achieves a thermal conductivity expressed as $$R=Q\times S1/S2$$

with R in the expression representing the thermal conductivity between the inner ring body 112a and the lower electrode 106, Q representing the thermal conductivity between the wafer W mounted on the electrostatic chuck 108 and the lower electrode 106, S1 representing the area of the upper surface (the surface exposed toward the processing chamber 102) of the inner ring body 112a and S2 representing the area of the bottom surface (the surface in contact with the lower electrode 106) of the inner ring body 112a. By adopting this structure, the thermal conductivity between the wafer W and the lower electrode 106 via the electrostatic chuck 108 and the thermal conductivity between the inner ring body 112a and the lower electrode 106 can be set roughly equal to each other. It is to be noted that other structural features are roughly identical to those of the etching apparatus 100.

The embodiment structured as described above does not require a gas supply mechanism for supplying the heat transfer gas to the space between the inner ring body 112a and the lower electrode 106. Consequently, the increase in the etching apparatus production cost can be minimized.

FIFTH EMBODIMENT

Figure 8:
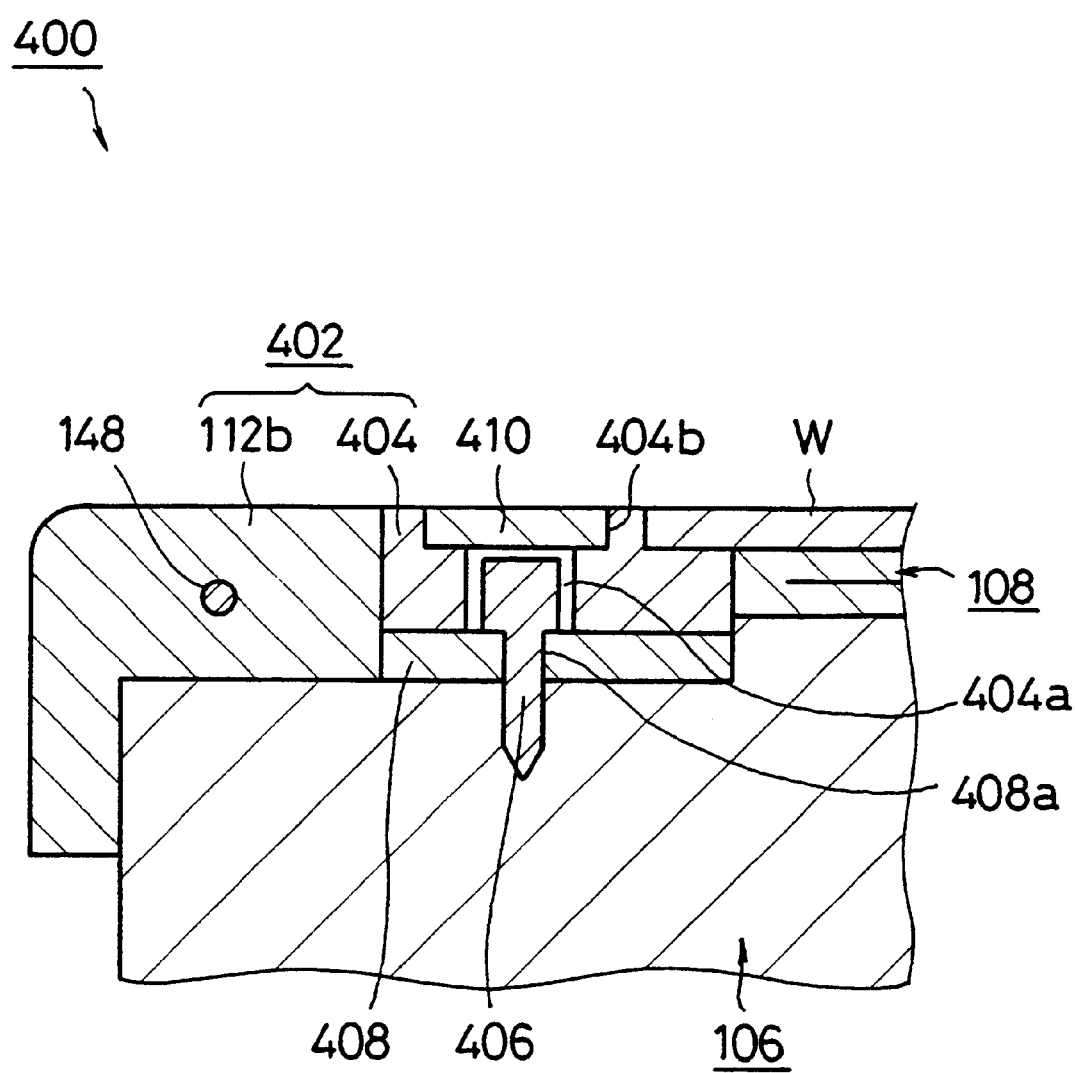
FIG. 8 is a schematic sectional view of yet another etching apparatus that may adopt the present invention.

An etching apparatus 400 in the fifth embodiment which may adopt the present invention is now explained in reference to FIG. 8.

A ring body 402 of the etching apparatus 400 is constituted of an inner ring body 404 of the embodiment and the outer ring body 112b explained earlier. The inner ring body 404 is constituted of a materials similar to that constituting the inner ring body 112a and is formed in a roughly circular shape. In addition, a plurality of through holes 404a at which screws 406 can be inserted are formed at the inner ring body 404. In addition, on the side of each through hole 404a toward the processing chamber 102, a countersunk hole 404b communicating with the through hole 404a is formed. Between the inner ring body 112a and the lower electrode 106, an aluminum plate 408 achieving a high thermal conductivity by, for instance, forming an $Al_2O_3$ film at the surface, is provided. In addition, through holes 408a at which the screws 406 can be inserted are formed at the aluminum plate 408 in correspondence to the individual through holes 404a.

When mounting the inner ring body 404, the aluminum plate 408 and the lower electrode 106 are placed in complete contact with each other using a thermally conductive tape (sheet) (not shown). In addition, the inner ring body 404 and the aluminum plate 408 are bonded using an adhesive (not shown). This structure, in which the inner ring body 404 is not fastened by the screws 406, prevents the inner ring body 404 from becoming damaged. The aluminum plate 408 is secured in complete contact with the lower electrode 106 by the plurality of screws 406. When securing the aluminum plate 408, the force with which the aluminum plate 408 is pressed against the lower electrode 106 is adjusted as appropriate by adjusting the tightening torque of the individual screws 406. Thus, the degree to which the aluminum plate 408 is attached to the lower electrode 106 is adjusted so that the thermal conductivity of the inner ring body 404 can be set to a desired level. As a result, the temperature of the wafer W and the temperature of the inner ring body 404 can be set roughly equal to each other. Furthermore, after the screws 406 are mounted, a screw cover 410 is fitted at each countersunk hole 404b to flatten the upper surface of the inner ring body 404. The screw covers 410 are constituted of a material similar to that constituting the inner ring body 404. It is to be noted that other structural features are roughly identical to those of the etching apparatus 100.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation is given above in reference to the embodiments on an example in which the etching apparatus employs a ring body constituted of an inner ring body and outer ring body, the present invention is not limited to this structural example, and may be adopted in an etching apparatus provided with a single conductive ring body.

Also, while an explanation is given above in reference to the embodiments on an example in which the controller adjusts the pressure regulating units based upon the information on the temperatures detected by the temperature sensors, the present invention is not limited to this structural example. For instance, curves representing the temperature changes at the inner ring body and the outer ring body may be set in the controller by performing advance etching processing on dummy wafers. Then, during regular processing, the pressure regulating units and the quantity of heat generated by the heater can be adjusted in conformance to the temperature change curves obtained in advance. This structure does not require temperature sensors for detecting the temperatures of the wafer and the ring body during the actual processing to be provided in the etching apparatus. As a result, a reduction in the etching apparatus production cost can be achieved.

Furthermore, while an explanation is given in reference to the embodiments on an example in which the heat transfer gas is supplied to the space between the wafer and the electrostatic chuck and to the space between the inner ring body and the lower electrode, the present invention is not limited to this structural example, and it may be adopted in a structure in which the heat transfer gas is supplied to the space between the outer ring body and the lower electrode as well as the spaces between the wafer and the electrostatic chuck and between the inner ring body and the lower electrode.

While an explanation is given above on an example in which the electrostatic chuck is constituted of polyimide, the present invention is not limited to this example. For instance, it may be adopted in an etching apparatus provided with a ceramic electrostatic chuck.

Moreover, while an explanation is given above in reference to the embodiment on an example in which a heater is provided inside the outer ring body, the present invention is not limited to this structural example. The present invention may be adopted in an etching apparatus having an outer ring body that has not provided with a means for heat application such as the heater employed in the embodiments.

While an explanation is given above in reference to the embodiments on etching apparatuses in which high-frequency power is applied to the lower electrode alone, the present invention is not limited to this structural example. The present invention may be adopted in an etching apparatus in which high-frequency power is applied to both the lower electrode and the upper electrode or to the upper electrode alone. In addition, the present invention may be adopted in other types of plasma processing apparatuses including ashing apparatuses and CVD apparatuses, as well as the etching apparatuses described above.

According to the present invention, uniform processing can be performed over the entire surface of the workpiece by achieving consistency in the concentration of radicals at the center and around the outer edges of the workpiece. As a result, elements can be formed even in the area very close to the outer edges of the workpiece so that an improvement in yield is achieved, particularly when processing a large workpiece.

INDUSTRIAL APPLICABILITY

The present invention can be adopted in semiconductor manufacturing apparatuses and, in particular, various types of plasma processing apparatuses such as etching apparatuses, ashing apparatuses and CVD apparatuses.

What is claimed is:

1. A plasma processing apparatus that performs plasma processing on a workpiece placed on an electrode provided inside a processing chamber, comprising;

an electrically conductive ring body encompassing the periphery of said workpiece placed on said electrode;

gas supply passage means through which a heat transfer gas is supplied to a space between said electrically conductive ring body and said electrode;

pressure regulation means for regulating the pressure of supplied heat transfer gas;

an electrically insulating ring body encompassing the periphery of said electrically conductive ring body;

means for heat application provided at said electrically insulating ring body; and control means for setting the temperature at said electrically conductive ring body and the temperature at said workpiece roughly equal to each other.

2. The plasma processing apparatus of claim 1, wherein said control means controls the pressure regulation means to set the temperature at said electrically conductive ring body and the temperature at said workpiece roughly equal to each other.

3. The plasma processing apparatus of claim 1, wherein said gas supply passage means comprises:

a first gas supply passage through which a heat transfer gas is supplied to the space between said electrically conductive ring body and said electrode;

a second gas supply passage through which heat transfer gas at a first pressure level is supplied to a space between said workpiece and said electrode;

a third gas supply passage through which heat transfer gas at a second pressure level is supplied to the space between said workpiece and said electrode;

a first link passage for linking said first gas supply passage with said second gas supply passage and that can be opened and closed freely;

a second link passage for linking said first gas supply passage and said third gas supply passage and that can be opened and closed freely; and wherein said control means controls the length of time over which said first link passage remains open and the length of time over which said second link passage remains open to set the temperature of said electrically conductive ring body and the temperature of said workpiece roughly equal to each other.

4. A plasma processing apparatus that performs plasma processing on a workpiece placed on an electrode provided inside a processing chamber, comprising:

an electrically conductive ring body encompassing the periphery of the workpiece placed on the electrode;

gas supply passage means through which a heat transfer gas is supplied to a space between said electrically conductive ring body and said electrode;

pressure regulation means for regulating the pressure of supplied heat transfer gas;

an electrically insulating ring body encompassing the periphery of said electrically conductive ring body; and control means for controlling the temperature at said electrically insulating ring body.

5. The plasma processing apparatus of claim 4, further including means for controlling the temperature at said electrically conductive ring body and the temperature of said workpiece.

6. The plasma processing apparatus of claim 4, further including a second gas supply passage means connected to said gas supply passage means and through which a heat transfer gas is supplied to a space between said workpiece and said electrode; and control means for controlling said pressure regulation means.

7. The plasma processing apparatus of claim 4, wherein said gas supply passage means comprises:

a first gas supply passage through which a heat transfer gas is supplied to the space between said conductive ring body and said electrode;

a second gas supply passage through which heat transfer gas at a first pressure level is supplied to a space between said workpiece and said electrode;

a third gas supply passage through which heat transfer gas at a second pressure level is supplied to the space between said workplace and said electrode;

a first link passage for linking said first gas supply passage with said second gas supply passage and that can be opened and closed freely;

a second link passage for linking said first gas supply passage with said third gas supply passage and that can be opened and closed freely; and control means for controlling the length of time over which said first link passage remains open and the length of time over which said second link passage remains open.

8. The plasma processing apparatus of claim 4, further comprising a thermal conductivity adjusting member provided between said electrode and said electrically conductive ring body to set the thermal conductivity between said electrode and said electrically conductive ring body and the thermal conductivity between said electrode and said workpiece roughly equal to each other.

9. The plasma processing apparatus of claim 4, further comprising means for applying a pressure to said electrically conductive ring body toward said electrode and for adjusting the level of pressure applied to said electrically conductive ring body.

10. A plasma processing apparatus that performs plasma processing on a workpiece placed on an electrode provided inside a processing chamber, comprising:

an electrically conductive ring body encompassing the periphery of the workpiece placed on the electrode;

gas supply passage means through which a heat transfer gas is supplied to a space between said electrically conductive ring body and said electrode;

pressure regulation means for regulating the pressure of supplied heat transfer gas;

an electrically insulating ring body encompassing the periphery of said electrically conductive ring body;

heating means provided at said electrically insulating ring body; and means for controlling the temperature at said electrically conductive ring body and the temperature of said workpiece.

* * * * *

UNITED STATES PATENT AND TRADEMARK OFFICE
CERTIFICATE OF CORRECTION

PATENT NO. : 6,676,804 B1 Page 1 of 1
APPLICATION NO. : 09/720910
DATED : January 13, 2004
INVENTOR(S) : Koshimizu et al.

It is certified that error appears in the above-identified patent and that said Letters Patent is hereby corrected as shown below:

In claim 4, column 16, line 18, "body; and" should read --body;--.

In claim 4, column 16, line 19, before "control" insert --heating means provided at said electrially insulating ring body; and--.

Signed and Sealed this

Twenty-seventh Day of February, 2007

JON W. DUDAS
*Director of the United States Patent and Trademark Office*